Nov. 25, 1969 D. A. STARR, JR 3,480,880
AMPLITUDE STABILIZED LC TRANSISTOR OSCILLATOR
Filed Oct. 9, 1967 2 Sheets-Sheet 1

INVENTOR.
DAVID A. STARR JR.
BY Irving Keschner
AGENT

AMPLITUDE STABILIZED LC TRANSISTOR OSCILLATOR

Filed Oct. 9, 1967

INVENTOR.
DAVID A. STARR JR.
BY Irving Kirchner
AGENT

United States Patent Office 3,480,880
Patented Nov. 25, 1969

3,480,880
AMPLITUDE STABILIZED LC TRANSISTOR OSCILLATOR

David A. Starr, Jr., San Mateo, Calif., assignor to Burroughs Corporation, Detroit, Mich., a corporation of Michigan Filed Oct. 9, 1967, Ser. No. 673,617
Int. Cl. H03b *3/02*
U.S. Cl. 331—109 9 Claims

ABSTRACT OF THE DISCLOSURE

A transistor oscillator system which includes a series resonant circuit, a parallel resonant circuit and a transistor. The resonant circuits consist of LC combinations. The transistor circuit oscillates at the resonant frequency of the series resonant circuit. The parallel resonant circuit acts to increase the overall gain of the oscillator since the transistor output current gain is less than one. The oscillator system includes impedance coupling to the series resonant circuit from the transistor output. An output buffer, an amplitude stabilizer and a control switch make up the remaining components of the oscillator system.

BACKGROUND OF THE INVENTION

The invention relates to a transistor oscillator system and in particular to an oscillator which employs an LC resonant circuit. A prior art patent which is directed to solving a similar problem as that of the present invention is described in Patent No. 3,297,963 of common ownership granted January 10, 1967 to C. P. Halsted. The Halsted patent discloses the combination of a control gate (or switch), oscillator and a buffer amplifier shown herein as elements 10, 11 and 12 in FIGURE 1. However, the present invention differs from that of Halsted in the following respects:

The present invention shows distinct circuitry which:

(1) provides for amplitude stabilization of the output waveform of the oscillator, (2) provides two resonant circuits for maintaining a different value of Q at the same resonant frequency, (3) couples the transistor output to the series resonant circuit by an inductive impedance (or alternatively a capacitive impedance), resulting in a greater frequency stabilization of the output waveform and, (4) utilizes the alpha current gain of a transistor, resulting in better bandwidth characteristics.

The typical problem involved in the prior art which deal with transistor oscillators is to obtain maximum frequency stability as well as amplitude stability of the oscillator output waveform. LC type oscillators are well-known in the art and are generally well adapted to the gated or continuous mode of operation. However, because of the undesirable damping which is introduced by output circuitry utilization means, LC oscillators are generally considered undesirable for generating highly stable wave trains.

The present invention overcomes the problem involving frequency stabilization by using impedance coupling to the first of two resonant circuits. This coupling introduces extremely small values of resistance into the series resonant branch thereby maintaining extremely low loss or high Q in the series resonant circuit. This low loss coupling to the series resonant circuit tends to maximize frequency stability. The parallel resonant circuit serves to generate the greater part of the operating current gain developed in the oscillator circuit. Typical alpha gain in the common base transistor used in the herein disclosed novel oscillator is 0.8 while the Q of the passive elements in the parallel resonant circuitry, including the impedance coupling, is approzximately 7. As to the amplitude control of a high frequency oscillator, prior art devices have utilized constant integrating circuits in conjunction with a non-linear device which develops a bias related to the amplitude of the oscillating waveform which tends to limit the oscillating amplitude to some steady state value. This technique would impose a dissipative loading or energy loss immediately across the series resonant circuit. The series resonant circuit will operate with damping or dissipation which will affect the ultimate frequency stability obtainable with the given resonant elements. The improved amplitude control circuit disclosed herein stabilizes or controls the amplitude of oscillation without introducing any loading across the series resonant circuit and thereby not affecting frequency stabilization.

SUMMARY OF THE INVENTION

The transistor oscillator circuit of the present invention includes a series resonant circuit, a parallel resonant circuit and a common base transistor. In order to maximize frequency stability an impedance coupling is utilized coupling the transistor base electrode to the series resonant circuit. An amplitude stabilizer circuit is used in such a manner that it stabilizes the amplitude of oscillation while not interfering with the frequency stabilization of the output oscillation waveform. The oscillator system also includes an output buffer which extracts an output signal from the series resonant circuit and control switch means (used for inductive impedance coupling) to initiate oscillation. The present invention greatly reduces the basic problem associated with LC oscillators, that of the dissipative loading introduced into the series resonant circuit which causes frequency and amplitude instability, by providing an impedance coupling feedback to the series resonant circuit which has a low loss and by further providing an amplitude stabilizer circuit which is designed not to introduce any loading across the series resonant circuit. The output buffer acts to isolate the series resonant circuit from any variations in the output loading.

The principal object of this invention is to provide an improved highly stabilized transistor controlled LC oscillator.

It is a further object of the present invention to provide an improved transistorized LC oscillator producing oscillations of substantially constant frequency and uniform amplitude.

It is a further object of this invention to provide amplitude stabilizing means which operates to maintain a stable amplitude while not affecting the frequency stabilization of the oscillator output waveform.

The above-listed objects and other aspects of the invention will be further explained in the following detailed description. For a more complete understanding of the invention reference may be had to the following detailed description read in conjunction with the drawings.

DESCRIPTION OF THE PREFERRED EMBODIMENT

Figure 1:
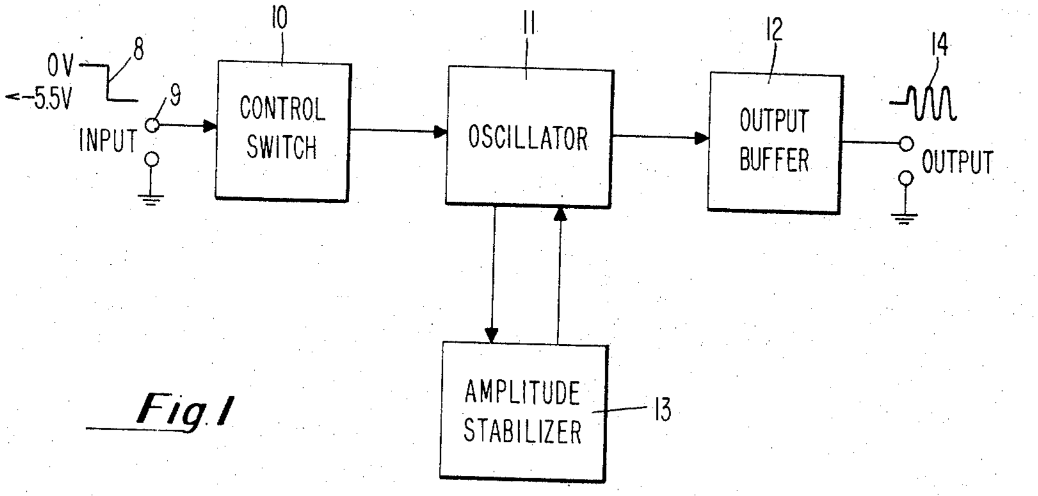
FIG. 1 illustrates in block diagram form an LC oscillator which is stabilized in accordance with the invention.

Referring now to FIG. 1, there is shown a block diagram of a stabilized LC oscillator, which embodies the principle of the invention. A negative input pulse 8 between 0 and −5.5 volts, for example, is applied to input 9. The input is then fed to control switch 10 which controls the application of the input pulse to oscillator 11. The output of oscillator 11 is extracted by output buffer 12, the output 14 of which is the desired oscillator waveform. Amplitude stabilizer 13 is operatively connected to oscillator 11 and maintains a predetermined output waveform amplitude. In operation the input pulse is fed directly to the oscillator 11. The oscillator includes a tuned resonant circuit which when shocked by the input pulse starts oscillating at a predetermined frequency as will be discussed later. The output buffer does not affect the overall stability of the oscillator circuit as it minimizes the loading or damping loss across the resonant circuit, and provides isolation of the oscillator from output load variations. The amplitude stabilizer 13 maintains the output amplitude of the oscillator waveform at a predetermined amplitude without introducing unnecessary damping or dissipation in the tuned resonant circuit and therefore not affecting the frequency stabilization of the oscillator itself. The double lines between oscillator 11 and amplitude stabilizer 13 are used to indicate the feedback relationship between both elements.

Figure 2:
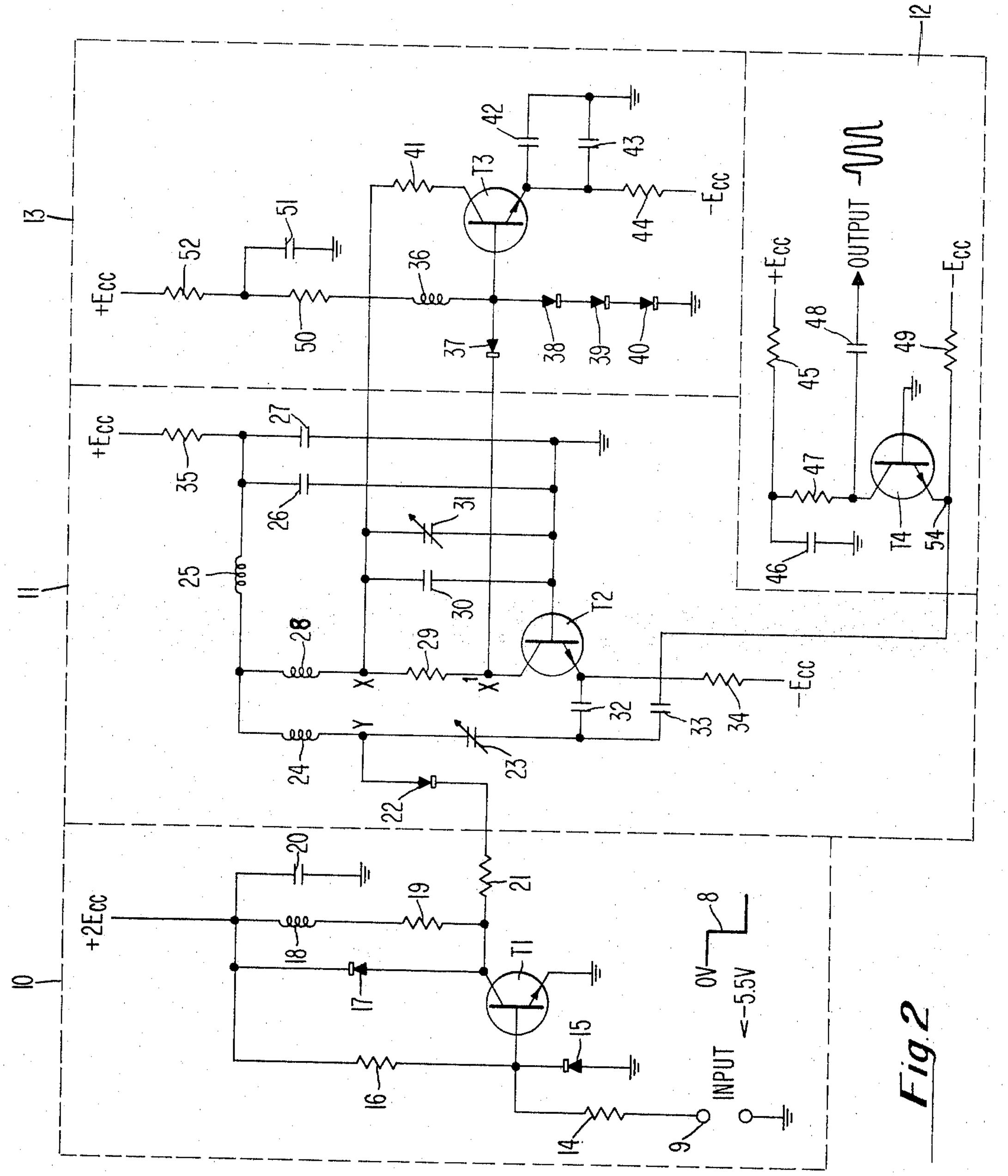
FIG. 2 is a schematic diagram of an LC oscillator system embodying the principles of the invention.

Referring now to FIG. 2 there is shown a schematic diagram of the preferred embodiment of the invention. The oscillator 11 comprises a common base transistor T2 whose emitter electrode is connected via resistor 34 to a source of voltage $-E_{cc}$. The collector electrode of T2 is connected through resistor 29, inductor 28, inductor 25 and resistor 35 to a source of positive potential, $E_{cc}$. The junction of inductor 28 and inductor 25 is connected to inductor 24 which is coupled to an adjustable capacitor 23 and then coupled to the emitter of transistor T2 by capacitor 32. The parallel combination of capacitor 30 and adjustable capacitor 31 couples the base of transistor T2 to point X between inductor 28 and resistor 29. Parallel capacitors 26 and 27 couple the base electrode of the transistor T2 to the junction of resistor 35 and inductor 25. The combination of capacitor 23 and inductor 24 is the series resonant circuit and the combination of capacitors 30 and 31 and inductors 25 and 28 is the parallel resonant circuit. When excited the series resonant circuit will oscillate at its natural frequency which is given as:

$$f=\frac{1}{2\pi\sqrt{L_{24}\cdot C_{23}}}$$

This is the frequency at which the transistor oscillator is designed to operate. It can be shown by well-known methods that the oscillator current gain is a product of the alpha (current gain of the common base transistor) and the Q (defined as the quality factor of a resonant circuit) of the parallel resonant circuit (the Q of passive elements 25, 28, 30 and 31). A typical value for alpha of the common base transistor is 0.8 and for the Q of the resonant circuit about 7. The majority of the operating current gain is developed in the passive elements and not in the active element T2. The inductor 25 also acts as an inductive impedance coupling element coupling the output of transistor T2 back to the series resonant circuit. The coupling performed by inductor 25 produces very small values of resistance in series with the series resonant branch. The extremely low loss coupling to the series resonant circuit tends to maximize frequency stability while minimizing the amount of resistive and other dissipative loss which normally would be introduced into the series resonant circuit.

The control switch 10 includes resistor 14 which couples the input pulse 8 from the input terminal 9 to the base electrode of common emitter transistor T1. Shunting transistor T1 is diode 15 which has its anode grounded and its cathode connected to the base of transistor T1 and also to a voltage source $2E_{cc}$ via resistor

16. The collector of transistor T1 is coupled to the voltage source $2E_{cc}$ via a parallel combination of diode 17 and a series combination of an inductor and resistor 18 and 19, respectively. Capacitor 20 shunts the voltage source $2E_{cc}$. Diode 17 is poled such that its anode is connected to the collector of transistor T1 and its cathode is connected to voltage source $2E_{cc}$. The output of transistor T1 is coupled to point Y in the oscillator circuit (the junction of adjustable capacitor 23 and inductor 24) via resistor 21 and diode 22, the diode being poled with its anode at the junction of capacitor 23 and inductor 24.

The amplitude stabilizer 13 comprises a common emitter transistor T3, the base electrode of which is connected to ground through a series connection of three diodes 38, 39, and 40, each diode being poled with its cathode towards ground, The base electrode is also connected to voltage source $E_{cc}$ through inductor 36 and resistors 50 and 52. Capicitor 51 shunts to ground the intersection of resistors 50 and 52. The emitter of transistor T3 is connected via resistor 44 to a source of voltage $-E_{cc}$. The parallel combination of capacitors 42 and 53 shunts resistor 44 to ground. The amplitude stabilizer is connected to the oscillator by resistor 41 between the collector of transistor T3 and point X and by diode 37 between the base of transistor T3 and point X′. Point X is the junction of inductor 28 and resistor 29 and point X′ is the collector of transistor T2. The diode is poled with its cathode towards point X′.

The output buffer 12 comprises a common base transistor T4, the emitter electrode of which is connected to a voltage source $-E_{cc}$ via resistor 49. Voltage source $E_{cc}$ is connected through resistor 45 and capacitor 46 to ground. The collector of transistor T4 is connected by resistor 47 to the junction of capacitor 46 and resistor 45. The output of the transistor oscillator system is taken from the collector of transistor T4 through a capacitor 48. Output buffer 12 is connected to the transistor oscillator 11 by a connection from the emitter electrode 54 of transistor T4 to capacitor 33 which is connected to the series resonant circuit between capacitors 32 and 33.

In operation, the transistor oscillator system is initially in an off condition. At zero signal input volts, the transistor T1 is saturated and the collector potential approaches a value near zero. The control switch 10 is connected to point Y of the oscillator 11 via resistor 21 and conducting diode 22. An initial direct current is flowing through inductor 24, inductor 25, and resistor 35. The value of resistor 21 determines the quiescent current in inductor 24. Upon application of the negative input pulse 8, diode 22 will be reverse biased (cut-off) by an amount approximately equal to $E_{cc}$. A sinusoidal voltage is developed at point Y which is associated with the time-rate of change of current in inductor 24 operating in conjunction with capacitor 23. The resonant circuit determined by capacitors 30 and 31 and inductors 25 and 28 also begins to oscillate, this latter resonant circuit also providing an overall current gain greater than one for the transistor system. The output of transistor T2 is coupled back to the series resonant circuit via inductor 25. It is generally known in the feedback oscillator art that the product of the gain of the amplifier system and the feedback factor should equal or be greater than one in order to satisfy the Barkhausen criterion and to sustain oscillation. The value of inductor 25 is critical and has been chosen to satisfy the Barkhausen criterion.

The common base output buffer stage provides excellent isolation for the current in the series resonant circuit against variations of loading which result from different output loading and against signals developed across the load. This is because the input impedance of a common base transistor does not vary greatly for an infinite variation of load impedance. A potential problem with the parallel configuration of transistors T2 and T4 arises with dissimilar emitter characteristics. For this reason coupling is provided by capacitors 32 and 33. An equal division of the current is obtained by setting capacitors 32 and 33 to equal values with their reactances being much larger than the common base input resistances of either T2 or T4. Diodes 37, 38, 39 and 40 of amplitude stabilizer 13 rectify and limit the output waveform at the collector of transistor T2 which is passed through to the base of transistor T3. Only negative portions of the waveform appearing at the collector of transistor T2 are passed by the diode 37. If the amplitude of the waveform at the collector of T2 is sufficiently large that its peak negative value cuts off transistor T3, the current through inductor 28 via resistor 41 will be reduced to zero or some very low value. This is in direct opposition to the normal sinusoidal increase of current in inductor 28 via resistor 29 and the collector of T2. Transistor T3 of amplitude stabilizer 13, in conjunction with the diode biases of diodes 38, 39 and 40, will thereby prevent transistor T2 from entering saturation and will stabilize the amplitude of the excitation in the circuitry associated with the collector of T2 which in turn stabilizes the amplitude of oscillation of the output waveform developed in the series resonant circuit 23 and 24. The amplitude stabilizer of the disclosed circuitry stabilizes and controls the amplitude of oscillation of the oscillator in a manner which does not introduce any loading across the first series resonant circuit and therefore does not affect the frequency stability of the oscillator circuit.

Representative values of circuit components schematically illustrated in FIG. 2 are listed hereinbelow. The component values are calculated to maintain an output waveform which oscillates at 230 kc.

Transistors T1, T2 and T4 are type 2N2846.
Transistor T3 is type 2N918.
All diodes are type IN916.
Resistor values are as follows:

$R_{14}$=430 ohms, 1 watt
$R_{16}$=2.4 kilohms, 1 watt
$R_{19}$=1.6 kilohms, 1 watt
$R_{21}$=120 ohms, 2 watts
$R_{29}$=200 ohms, 2 watts
$R_{34}$=390 ohms, 2 watts
$R_{35}$=8.2 ohms, 1 watt
$R_{41}$=390 ohms, 1 watt
$R_{44}$=680 ohms, 1 watt
$R_{45}$=8.2 ohms, 1 watt
$R_{47}$=220 ohms, 2 watts
$R_{49}$=390 ohms, 2 watts
$R_{50}$=3.3 kilohms, 1 watt
$R_{52}$=8.2 ohms, 1 watt Capacitor values are as follows:

$C_{20}$=6.8 $\mu$f.
$C_{23}$=3,460 $\mu\mu$f.
$C_{26}$=1 $\mu$f.
$C_{27}$=6.8 $\mu$f.
$C_{30}$=.0168 $\mu$f.
$C_{31}$=170–780 $\mu\mu$f. (trimmer)
$C_{32}$, $C_{33}$=0.1 $\mu$f.
$C_{42}$=6.8 $\mu$f.
$C_{43}$=.05 $\mu$f.
$C_{46}$=.05 $\mu$f.
$C_{48}$=0.1 $\mu$f.
$C_{51}$=.05 $\mu$f.

Inductor values are as follows:

$L_{18}$=100 $\mu$h.
$L_{24}$=138.4 $\mu$h.
$L_{28}$=27.68 $\mu$h.
$L_{25}$=0.5437 $\mu$h.
$L_{36}$=2.5 mh.
$E_{cc}$=12 volts The circuit element values recited hereinabove have been calculated to give a frequency of oscillation of 230 kilocycles with maximum frequency stability and amplitude control.

Figure 3:
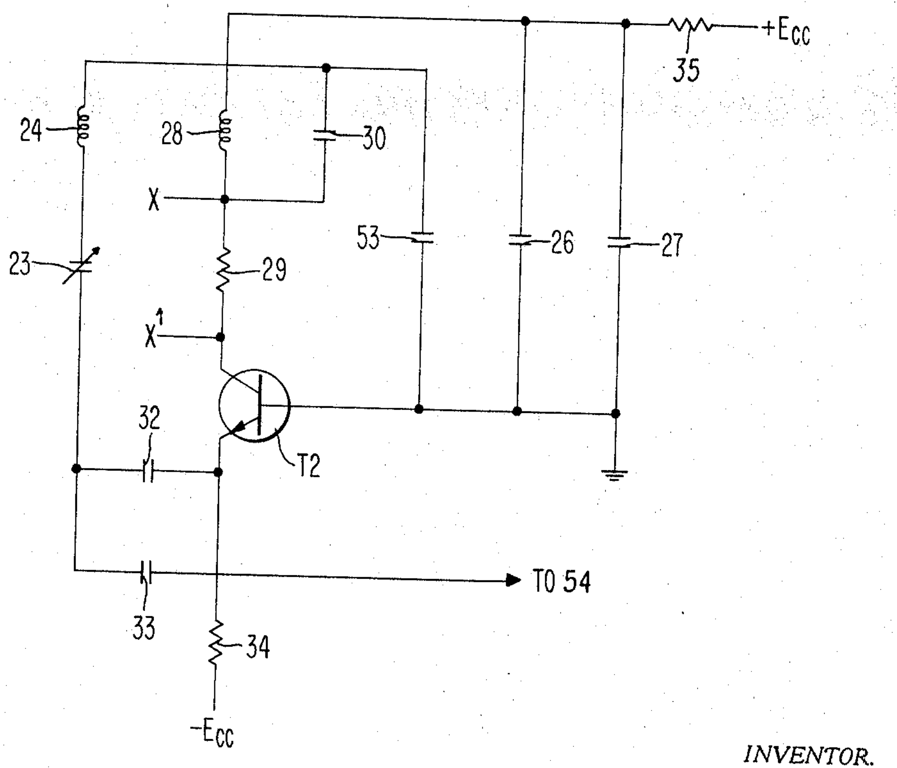
FIG. 3 is a schematic diagram for an LC oscillator utilizing capacitive impedance coupling in accordance with the invention.

Referring now to FIG. 3 there is shown a schematic diagram of an oscillator circuit embodying the principles of my invention and using capacitive impedance coupling between the base electrode of T2 and inductor 24 of the series resonant circuit. In this embodiment the control switch is unnecessary since the oscillator will operate in its continuous mode when source $E_{cc}$ is connected to the circuit therefore there is no connection to point Y between capacitor 23 and inductor 24 as shown in FIG. 2. The elements in FIG. 3 are identical to the similarly numbered elements in FIG. 2. Capacitor 23 and inductor 24 comprise the series resonant circuit and inductor 28 in parallel with the series combination of capacitors 30 and 53 comprise the parallel resonant circuit. In the inductive coupled embodiment of FIGURE 2 the inductor 25 of the parallel resonant circuit is the feedback coupling from base of transistor T1 to the series resonant circuit. Analogously, in the embodiment of FIGURE 3, a capacitor of the parallel resonant circuit is the feedback coupling between the base of transistor T1 and the series resonant circuit. The capacitor which performs the coupling function is capacitor 53. The value of capacitor 53 necessary for oscillation at 230 kilocycles is 1 $\mu$f. As in the inductive coupled embodiment of FIGURE 2 the output of the oscillator in the capacitive coupled embodiment is connected to the output buffer 12 through capacitor 33.

Amplitude stabilizer 13 is connected to the oscillator at the points X–X′ (across resistor 29) as in the embodiment of FIGURE 2. Thus it is seen that the embodiment of FIGURE 3 illustrates the transistor oscillator including capacitive frequency stabilization, amplitude stabilization without affecting frequency stabilization, and isolation of the resonant circuits from variations in the output loading.

It is to be understood that the foregoing explanation is by way of illustration only. As will be evident to those skilled in the art the invention may be adapted to fabricate stable LC oscillator circuits by considerably varying the actual component values from those indicated above. Further one skilled in the art could adapt the schematics shown in FIGS. 2 and 3 to accommodate either NPN or PNP transistors merely by choosing the appropriate biasing potentials. It will therefore be understood by those skilled in the art that various changes in form and details may be made therein without departing from the spirit and scope of the invention.

What is claimed is:

1. A transistor oscillator circuit comprising:
a transistor with base, emitter, and collector electrodes,
a first resonant circuit operatively connected between said transistor emitter and collector electrodes,
a second resonant circuit operatively connected between said base and collector electrodes of said transistor,
impedance means operatively coupling said transistor base electrode to said first resonant circuit for stabilizing the frequency of oscillation, and
amplitude stabilizer means resistively coupled to the collector electrode of said transistor for preventing said transistor from going into saturation.

2. The transistor oscillator circuit defined in claim 1 wherein the empedance coupling means is an inductor.

3. The transistor oscillator circuit defined in claim 1 wherein the impedance coupling means is a capacitor.

4. A transistor oscillator system comprising:
a transistor with base, emitter and collector electrodes,
a series resonant circuit, operatively connected between said emitter and collector electrodes,
a parallel resonant circuit operatively connected between said base and collector electrodes,
impedance coupling means operatively connected between said base electrode and said series resonant circuit, means including a low input impedance buffer amplifier for extracting signals from said series resonant circuit, and amplitude stabilizer means resistively connected to said collector electrode for preventing said transistor from saturating.

5. The system as defined in claim 4 wherein said amplitude stabilizer means includes a diode rectifying and limiting network and a common emitter transistor amplifier driven by said network.

6. The circuit as defined in claim 5 wherein said series and parallel resonant circuits each comprise an inductor-capacitor tuned circuit, and wherein the impedance coupling means is an inductor, and wherein gate means is utilized for initiating a current supply to said series resonant circuit.

7. The circuit as defined in claim 5 wherein said series and parallel resonant circuits each comprises an inductor-capacitor tuned circuit and the impedance coupling means is a capacitor.

8. The circuit as defined in claim 6 wherein said low input impedance buffer amplifier includes a common base transistor amplifier and wherein is employed capacitive means for connecting the output of said series resonant circuit to the emitter of said transistor and to the emitter of said common base transistor amplifier.

9. The circuit as defined in claim 7 wherein said low input impedance buffer amplifier includes a common base transistor amplifier and wherein is employed capacitive means for connecting the output of said series resonant circuit to the emitter electrode of said transistor and to the emitter of said common base transistor amplifier.

References Cited

UNITED STATES PATENTS

| | | | |
|---|---|---|---|
| 2,960,666 | 11/1960 | Brewster et al. | 331—109 |
| 2,984,794 | 5/1961 | Carter et al. | 331—117 X |
| 3,088,079 | 4/1963 | Quigley | 331—117 X |
| 3,146,408 | 8/1964 | Missim et al. | 331—117 X |
| 3,297,963 | 1/1967 | Halsted | 307—253 X |

ROY LAKE, Primary Examiner

S. H. GRIMM, Assistant Examiner

U.S. Cl. X.R.

307—246, 253; 331—117, 166, 173, 183

PO-1050
(5/69)

UNITED STATES PATENT OFFICE
CERTIFICATE OF CORRECTION

Patent No. 3,480,880 Dated November 25, 1969

Inventor(s) David A. Starr

It is certified that error appears in the above-identified patent and that said Letters Patent are hereby corrected as shown below:

Column 2, line 3, "approzximately" should be --approximately--; column 4, line 16 "ground," should be --ground.--; column 4, line 21, "42 and 53" should be --42 and 43--.

SIGNED AND
SEALED
JUN 9 1970

(SEAL)
Attest:

Edward M. Fletcher, Jr.
Attesting Officer

WILLIAM E. SCHUYLER, JR.
Commissioner of Patents